US009218991B2

(12) United States Patent
Briere

(10) Patent No.: US 9,218,991 B2
(45) Date of Patent: Dec. 22, 2015

(54) ION IMPLANTATION AT HIGH TEMPERATURE SURFACE EQUILIBRIUM CONDITIONS

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/170,293

(22) Filed: Jan. 31, 2014

(65) Prior Publication Data

US 2014/0147998 A1 May 29, 2014

Related U.S. Application Data

(63) Continuation-in-part of application No. 13/788,318, filed on Mar. 7, 2013, now Pat. No. 8,692,219, which is a continuation of application No. 12/006,562, filed on Jan. 3, 2008, now Pat. No. 8,395,132.

(60) Provisional application No. 61/763,895, filed on Feb. 12, 2013, provisional application No. 60/937,101, filed on Jun. 25, 2007.

(51) Int. Cl.
*A61N 5/00* (2006.01)
*H01L 21/67* (2006.01)
(Continued)

(52) U.S. Cl.
CPC ........ *H01L 21/67011* (2013.01); *C30B 29/403* (2013.01); *C30B 31/20* (2013.01);
(Continued)

(58) Field of Classification Search
CPC ....... H01J 37/00; H01J 37/3171; H01J 37/36; H01J 37/317; H01J 37/3172; H01J 2237/31701; H01J 2237/3365; H01L 21/046; H01L 21/22; H01L 21/265; H01L 21/24; H01L 21/28052; H01L 21/00; H01L 21/2253; H01L 21/2652; H01L 21/2656; H01L 21/2822; H01L 21/31155; H01L 21/76859
USPC ................. 250/492.1, 492.2, 492.21, 492.22, 250/492.23, 492.3
See application file for complete search history.

(56) References Cited

U.S. PATENT DOCUMENTS 3,747,203 A * 7/1973 Shannon ........................ 438/57
4,514,636 A * 4/1985 King ........................ 250/443.1
(Continued)

FOREIGN PATENT DOCUMENTS

JP     2001-308196     11/2001
JP     2009130106 A     6/2009
(Continued)

OTHER PUBLICATIONS

English Translation of Relevant Parts of the Japanese Pre-Appeal Examination Report dated Jan. 6, 2015, for Japanese Patent Application 2011-050366.
(Continued)

*Primary Examiner* — Jack Berman
*Assistant Examiner* — Jason McCormack
(74) *Attorney, Agent, or Firm* — Farjami & Farjami LLP

(57) ABSTRACT

There are disclosed herein various implementations of a method and system for ion implantation at high temperature surface equilibrium conditions. The method may include situating a III-Nitride semiconductor body in a surface equilibrium chamber, establishing a gas pressure greater than or approximately equal to a surface equilibrium pressure of the III-Nitride semiconductor body, and heating the III-Nitride semiconductor body to an elevated implantation temperature in the surface equilibrium chamber while substantially maintaining the gas pressure. The method also includes implanting the III-Nitride semiconductor body in the surface equilibrium at the elevated implantation temperature chamber while substantially maintaining the gas pressure, the implanting being performed using an ion implanter interfacing with the surface equilibrium chamber.

20 Claims, 8 Drawing Sheets

(51) Int. Cl.
| | |
|---|---|
| *C30B 29/40* | (2006.01) |
| *C30B 33/04* | (2006.01) |
| *H01L 21/02* | (2006.01) |
| *H01J 37/317* | (2006.01) |
| *H01L 21/265* | (2006.01) |
| *H01L 21/324* | (2006.01) |
| *C30B 31/20* | (2006.01) |
| *H01L 29/20* | (2006.01) |

(52) U.S. Cl.
CPC ............ *C30B 33/04* (2013.01); *H01J 37/3171* (2013.01); *H01L 21/0254* (2013.01); *H01L 21/02381* (2013.01); *H01L 21/02573* (2013.01); *H01L 21/26546* (2013.01); *H01L 21/3245* (2013.01); *H01J 2237/043* (2013.01); *H01J 2237/188* (2013.01); *H01J 2237/304* (2013.01); *H01J 2237/31711* (2013.01); *H01J 2237/31713* (2013.01); *H01L 29/2003* (2013.01)

(56) References Cited

U.S. PATENT DOCUMENTS

| | | | | |
|---|---|---|---|---|
| 4,698,233 | A | * | 10/1987 | Ohira et al. ................... 148/222 |
| 4,774,416 | A | * | 9/1988 | Askary et al. ............... 250/492.2 |
| 5,385,862 | A | | 1/1995 | Moustakas |
| 5,637,146 | A | | 6/1997 | Chyi |
| 5,866,925 | A | * | 2/1999 | Zolper et al. .................. 257/279 |
| 6,329,215 | B1 | | 12/2001 | Porowski |
| 8,093,597 | B2 | | 1/2012 | Briere |
| 8,395,132 | B2 | | 3/2013 | Briere |
| 8,692,219 | B2 | | 4/2014 | Briere |
| 2004/0063289 | A1 | * | 4/2004 | Ohta ............................. 438/303 |
| 2004/0107906 | A1 | | 6/2004 | Collins |
| 2004/0207029 | A1 | | 10/2004 | Braddock |
| 2005/0136627 | A1 | | 6/2005 | Melas |
| 2005/0191828 | A1 | | 9/2005 | Al-Bayati |
| 2005/0196945 | A1 | * | 9/2005 | Yun et al. ..................... 438/586 |
| 2006/0219938 | A1 | * | 10/2006 | Huang ..................... 250/432 R |
| 2007/0004176 | A1 | | 1/2007 | Tauzin |
| 2007/0075274 | A1 | | 4/2007 | Reece |
| 2008/0315129 | A1 | | 12/2008 | Briere |
| 2010/0171126 | A1 | | 7/2010 | Briere |
| 2011/0316003 | A1 | | 12/2011 | Murphy |

FOREIGN PATENT DOCUMENTS

| | | |
|---|---|---|
| JP | 2009266981 A | 11/2009 |
| WO | WO9216966 A1 | 10/1992 |
| WO | WO9856046 A1 | 12/1998 |
| WO | WO 2009/029329 | 3/2009 |
| WO | WO 2010/051266 | 5/2010 |

OTHER PUBLICATIONS

Japanese Pre-Appeal Examination Report dated Jan. 6, 2015, for Japanese Patent Application 2011-050366.

* cited by examiner

ION IMPLANTATION AT HIGH TEMPERATURE SURFACE EQUILIBRIUM CONDITIONS The present application claims the benefit of and priority to a provisional application entitled "Ion Implantation at High Temperature Surface Equilibrium Conditions," Ser. No. 61/763,895 filed on Feb. 12, 2013. In addition, the present application is a continuation-in-part of application Ser. No. 13/788,318, entitled "Method and Apparatus for Growing a III-Nitride Layer," filed on Mar. 7, 2013, which is itself a continuation of application Ser. No. 12/006,562, entitled "Ion Implanting While Growing a III-Nitride Layer," filed on Jan. 3, 2008, and issued as U.S. Pat. No. 8,395,132 on Mar. 12, 2013, which in turn claims priority to provisional application Ser. No. 60/937,101 filed on Jun. 25, 2007. The disclosures in the above-referenced patent and patent applications are hereby incorporated fully by reference into the present application. Moreover, the present application claims priority to each one of the patent and patent applications identified above.

BACKGROUND

Definition

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

BACKGROUND ART

III-Nitride materials are semiconductor compounds that have relatively wide direct bandgaps and can have strong piezoelectric polarizations, which can enable high breakdown fields, high saturation velocities, and the creation of two-dimensional electron gases (2DEGs), when combined as stacked layers. As a result, III-Nitride materials are suitable for use in many microelectronic applications as field-effect transistors (FETs), including heterostructure FETs (HFETs) such as high electron mobility transistors (HEMTs).

However, one of the challenges posed by III-Nitride semiconductor device fabrication is doping a III-Nitride semiconductor body without compromising its stoichiometric integrity. Specifically, it is known that at high temperatures, for example temperatures greater than approximately 800° C., nitrogen may escape from the III-Nitride surface, resulting in its decomposition. A conventional approach to address this problem utilizes a technique for growing the dopants into the III-Nitride body as it is formed, rather than performing ion implantation. A significant drawback of that approach, however, is that it results in formation of relatively homogenously doped layers within the III-Nitride body. Consequently, differential doping is typically achieved only vertically, so that spatially confined doping in the lateral direction may not be achieved directly through such growth except through the use of relatively complex and expensive etch and redeposition/regrowth methods.

SUMMARY

The present disclosure is directed to ion implantation at high temperature surface equilibrium conditions, substantially as shown in and/or described in connection with at least one of the figures, and as set forth more completely in the claims.

DETAILED DESCRIPTION

Figure 1:
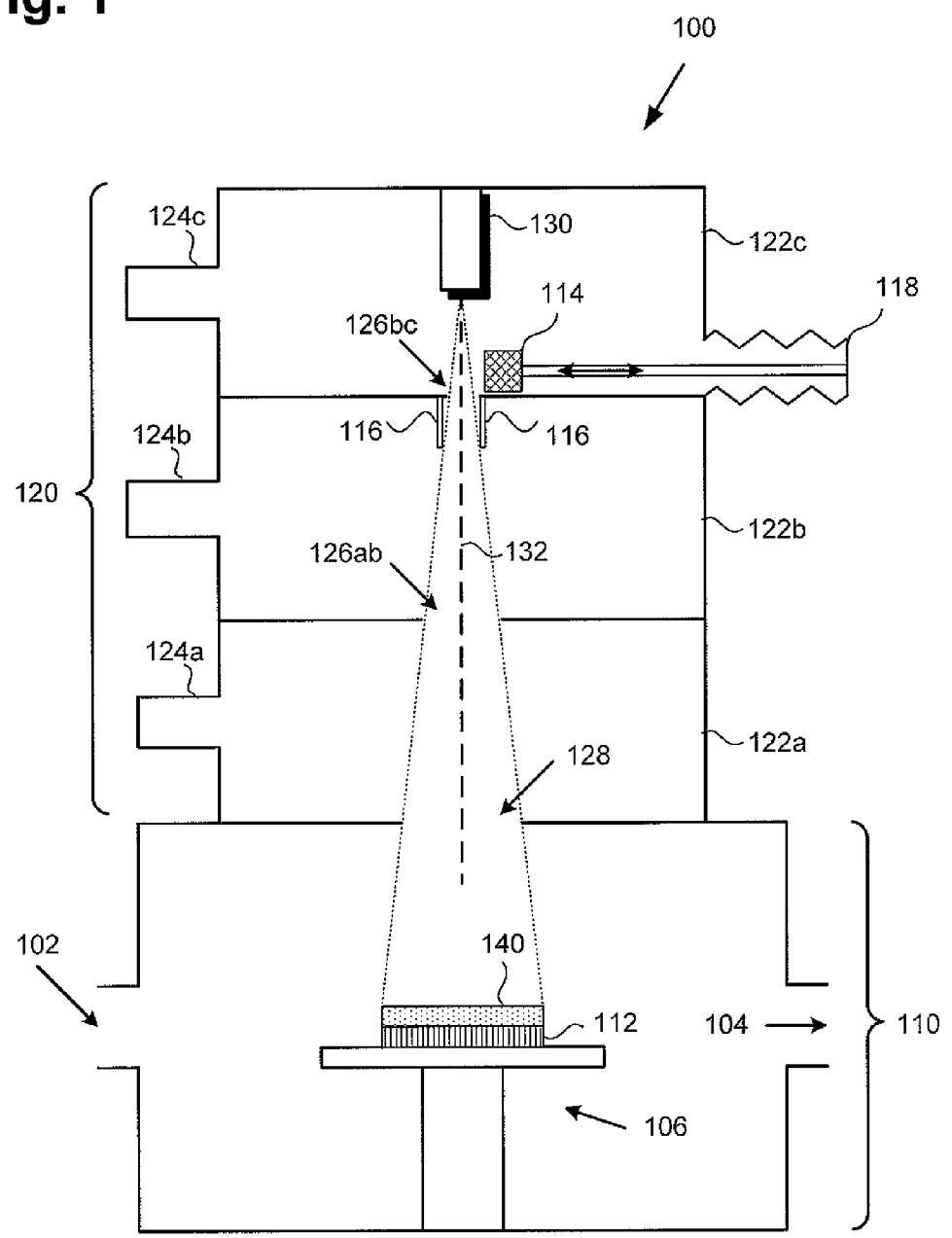
FIG. 1 shows a cross-sectional view of an implantation chamber for performing ion implantation at high temperature surface equilibrium conditions, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present application is directed to a method and system for ion implantation of a III-Nitride semiconductor body. As disclosed herein, ion implantation of the III-Nitride semiconductor body may be performed at elevated temperatures and equilibrium pressure in an implantation chamber. For example, in some implementations, ion implantation may be performed in the surface and near surface regions of the III-Nitride semiconductor body. In some implementations, the present solution can eliminate or reduce the requirements for post implant high temperature anneals, required for dopant activation, that are typically a necessity in the conventional art. Moreover, the present solution may provide a system enabling dopant activation through in-situ annealing of the implant damage and activation of the dopants, while avoiding the decomposition of the III-Nitride semiconductor body stoichiometry.

FIG. 1 shows a cross-sectional diagram of implantation chamber 100 for ion implantation at high temperature surface equilibrium conditions, according to one implementation. As shown in FIG. 1, implantation chamber 100 includes surface equilibrium chamber 110, ion implanter 130, and transition chamber 120 interfacing ion implanter 130 with surface equilibrium chamber 110. As further shown in FIG. 1, transition chamber 120 includes differential pressure cells 122a, 122b, and 122c. Also shown in FIG. 1 is III-Nitride semiconductor body 140, such as a gallium nitride (GaN) body, for example, grown over support substrate 112. Support substrate 112 may be any suitable substrate material for the growth of III-Nitride semiconductor body, and may include silicon, silicon carbide, sapphire, and when available, a native III-Nitride semiconductor substrate, for example.

According to the present implementation, surface equilibrium chamber 110 includes platform 106, which may be a rotating platform or a controllably moveable platform, for example, on which support substrate 112 and III-Nitride semiconductor body 140 may be placed during ion implantation of III-Nitride semiconductor body 140. As shown in FIG. 1, surface equilibrium chamber 110 is equipped with intake port 102 to allow for the entry of a gas or gases for establishing surface equilibrium conditions for III-Nitride semiconductor body 140, as well as output port 104 for the removal of such gas or gases. Surface equilibrium chamber 110 is designed such that the equilibrium pressure within surface equilibrium chamber 110 is controlled to sustain a partial vacuum range of approximately one to approximately one thousand millitorr (1.0-1000 mTorr). In one implementation, for example, surface equilibrium chamber 110 may be controlled to sustain a partial vacuum range of approximately 100 mTorr.

Ion implanter 130 may provide ions for implantation into III-Nitride semiconductor body 140 as ion beam 132, and may perform selective implantation of portions of III-Nitride semiconductor body 140. In general, ion implanter 130 is an apparatus that produces and may focus ion beam 132 of substantially identical ions having a well controlled velocity and mass from a solid or gaseous source material. In some implementations, ion beam 132 can be a focused ion beam with the ability to write or raster over the surface of III-Nitride semiconductor body 140, such as by being steered over the surface of III-Nitride semiconductor body 140. In other implementations, ion beam 132 can be a wide area focused ion beam allowing for blanket ion implantation, or implantation using stencil masks or sacrificial mask layers over a larger area of III-Nitride semiconductor body 140. Such masks may include common materials well known in the art, and may be organically based, or may be formed of photoresist, silicon dioxide, or silicon nitride, for example.

Transition chamber 120 may be utilized to provide a suitable environment, such as a low pressure or high vacuum environment, for ion implanter 130 and its interaction with surface equilibrium chamber 110. Transition chamber 120 serves to interface ion implanter 130 with surface equilibrium chamber 110, which is configured to provide surface equilibrium conditions for III-Nitride semiconductor body 140 during ion implantation.

In order to enable interface of ion implanter 130 with surface equilibrium chamber 110, differential pumping may be used to evacuate transition chamber 120. As shown in FIG. 1, in one implementation, transition chamber 120 may include several differential pressure cells 122a, 122b, and 122c. Each differential pressure cell 122a, 122b, and 122c is in communication with an adjacent differential pressure cell through respective apertures 126ab and 126bc. It is noted that ion beam 132 passes through apertures 126bc and 126ab to travel through transition chamber 120, which interfaces ion implanter 130 with surface equilibrium chamber 110 through linking aperture 128. Differential pressure cells 122a, 122b, and 122c may be selectably evacuated using respective pumping apertures 124a, 124b, and 124c.

As further shown in FIG. 1, in some implementations, differential pressure cell 122c of transition chamber 120 may also include Faraday cup 114. When present, Faraday cup 114 may be linked to a current meter (not shown in FIG. 1) to measure the implant dosage of ions being received from ion implanter 130. In one implementation, Faraday cup 114 may be attached to bellows 118 (or another type of mechanical linear actuator used in vacuum technology) to allow Faraday cup 114 to be moved into and out of the path of ion beam 132. It is noted that, in some implementations, it may be advantageous or desirable to situate Faraday cup 114 within differential pressure cell 122c to provide for a more accurate reading of the ion beam flux prior to possible neutralization of the ions. Such ion neutralization may occur as ion beam 132 passes through differential pressure cells 122a, 122b, and 122c, and surface equilibrium chamber 110. However, in one implementation, Faraday cup 114 may be incorporated into aperture 126bc.

It is noted that Faraday cup 114 may be periodically positioned in the path of ion beam 132 (e.g., approximately 1% of the time) in order to measure the implant dosage being directed at III-Nitride semiconductor body 140, thereby enabling estimation of the concentration of ions implanted into III-Nitride semiconductor body 140. This periodic positioning may be accomplished by actuation of bellows 118 at a predetermined periodicity. As an alternative example, Faraday cup 114 may be mounted on a rotating plate or wheel or armature (not shown in FIG. 1) within differential pressure cell 122c, such that Faraday cup 114 rotates under ion beam 132 at a predetermined rate (e.g., 1% of the implant time).

Transistion chamber 120 according to the present implementation may further include deflection plates, such as deflection plates 116, positioned inside differential pressure cell 122b, for example, near aperture 126bc. Deflection plates 116 may be used to change the direction of ion beam 132 entering surface equilibrium chamber 110, for example, so as to steer ion beam 132 over the surface of III-Nitride semiconductor body 140.

Figure 2:
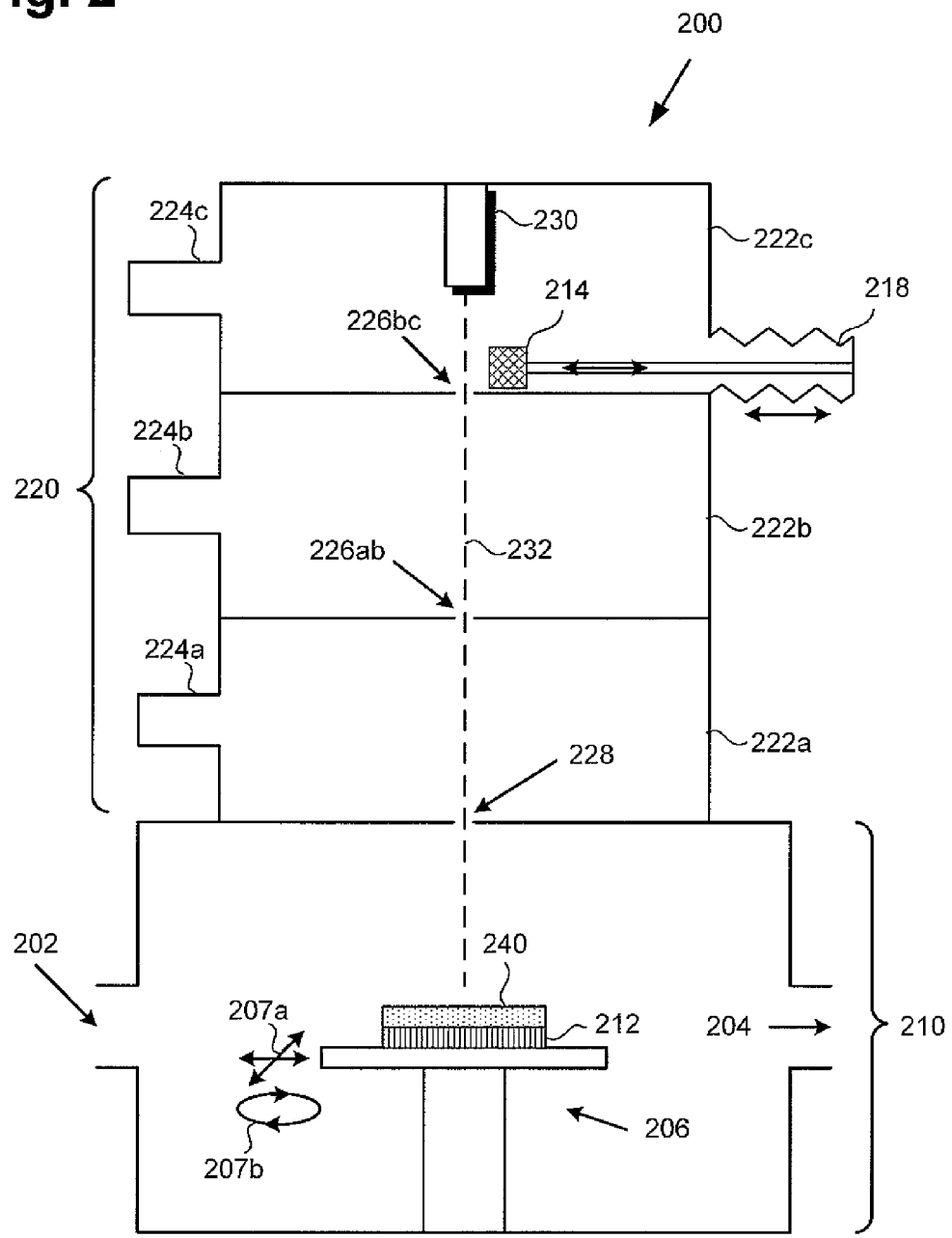
FIG. 2 shows a cross-sectional view of an implantation chamber for performing ion implantation at high temperature surface equilibrium conditions, according to another implementation.

Referring to FIG. 2, FIG. 2 shows a cross-sectional view of implantation chamber 200 for performing ion implantation at high temperature surface equilibrium conditions, according to another implementation. Implantation chamber 200 includes surface equilibrium chamber 210, ion implanter 230, and transition chamber 220 interfacing ion implanter 230 with surface equilibrium chamber 210. Transition chamber 220 includes differential pressure cells 222a, 222b, and 222c having respective differential pumping apertures 224a, 224b, and 224c. Surface equilibrim chamber 210 includes intake port 202, output port 204, and platform 206. As shown in FIG. 2, III-Nitride semiconductor body 240 and support substrate 212 are situated on platform 206. Also shown in FIG. 2 are Faraday cup 214, bellows 218, ion beam 232, appertures 226ab and 226bc, and linking aperture 228. Implantation chamber 200 including surface equilibrium chamber 210, ion implanter 230, and transition chamber 220 corresponds in general to implantation chamber 100 including surface equilibrium chamber 110, ion implanter 130, and transition chamber 120, in FIG. 1.

According to the exemplary implementation shown in FIG. 2, ion beam 232 may be a focused ion beam produced so as to impinge upon III-Nitride semiconductor body 240 in the absence of ion beam steering, provided, for example, by deflection plates 116, in FIG. 1. Rather, in the present implementation, platform 206 is shown as a controllably moveable platform, such as a rotating platform for example, as indicated by linear displacement lines 207a and/or rotational arrows 207b. In this implementation, aperture 226ab and linking aperture 228 may be made much smaller, and the pressure in transition chamber 220 can more easily reduced, than in the implementation shown in FIG. 1.

The operation of exemplary implantation chambers 100 and 200 will be further described by reference to flowchart 300, in FIG. 3, which outlines an exemplary method for performing ion implantation of a III-Nitride semiconductor body at high temperature surface equilibrium conditions. It is noted that certain details and features have been left out of flowchart 300 that are apparent to a person of ordinary skill in the art.

Figure 3:
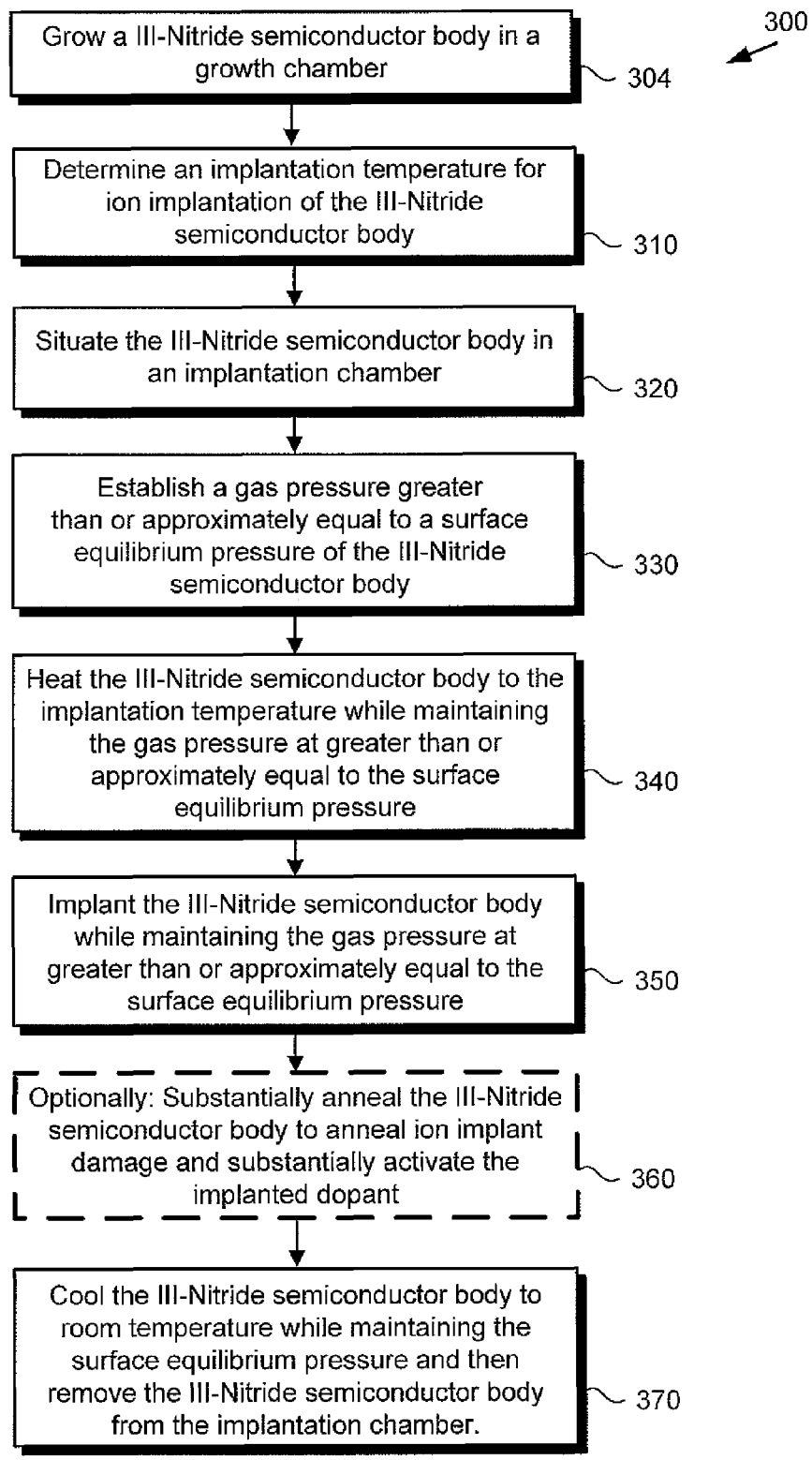
FIG. 3 shows a flowchart presenting an exemplary method for performing ion implantation at high temperature surface equilibrium conditions.

Referring to FIG. 3 with continuing reference to FIGS. 1 and 2, flowchart 300 begins with growing III-Nitride semiconductor body 140/240 in a growth chamber (304). III-Nitride semiconductor body 140/240 may be grown over support substrate 112/212, which may be any suitable substrate for III-Nitride growth, such as a silicon, silicon carbide (SiC), or aluminum oxide ($Al_2O_3$) substrate, or a native III-Nitride substrate, for example. It is noted that as used herein, the term silicon substrate refers to a semiconductor substrate that includes at least one layer of silicon. This includes silicon based composite substrates such as silicon-on-insulator (SOI) and separation by implantation of oxygen (SIMOX) process substrates, as well as silicon on sapphire (SOS) substrates for example. Such a silicon substrate may also contain silicon devices and vias formed on or within the silicon substrate.

Growth of III-Nitride semiconductor body 140/240 may occur in implantation chamber 100/200. In some implementations, surface equilibrium chamber 110/210 may have been configured as a growth chamber 110/210 during a growth phase of III-Nitride semiconductor body 140/240. That is to say, chamber 110/210 may be configurable first as growth chamber 110/210 and subsequently as surface equilibrium chamber 110/210 during fabrication and processing of III-Nitride semiconductor body 140/240. In other implementations, however, III-Nitride semiconductor body 140/240 may be grown in a growth chamber apart from ion implantation chamber 100/200.

Growth of III-Nitride semiconductor body 140/240 may be performed using any suitable growth technique, such as metalorganic chemical vapor deposition (MOCVD) or molecular-beam epitaxy (MBE), for example. Growth of III-Nitride semiconductor body 140/240 may occur in any suitable atmospheric and thermal environment for growing III-Nitride materials, such as in the presence of nitrogen gas or a nitrogen precursor gas like ammonia, as well as additional reactant gases such as trimethylgallium (TMG) and trimethylaluminum (TMA), for instance.

In one implementation, III-Nitride semiconductor body 140/240 may be grown using the MOCVD technique and may be deposited on support substrate 112/212, which may be a silicon substrate. As a result, in some implementations, III-Nitride semiconductor body 140/240 may include an amorphous silicon aluminum nitride based layer, one or more aluminum nitride (AlN) nucleation layers, compositionally graded transition layers, one or more strain absorbing transition interlayer modules, a buffer layer, a channel layer, an AlN spacer layer, one or more barrier layers, and/or one or more III-Nitride capping layers.

Flowchart 300 continues with determining an implantation temperature for ion implantation of III-Nitride semiconductor body 140/240 (310). More generally, however, such a determination may include identifying additional implantation conditions for ion implantation of III-Nitride semiconductor body 140/240. In addition to determination of implantation temperature, implantation conditions to be identified may include a number of other variables, such as the ion species to be implanted, the desired depth of implantation, and the gas species used in the surface equilibration chamber 110/210 to be utilized during implantation, for example. In addition, implantation conditions may include whether ion beam 132/232 is to be a focused ion beam with the ability to write or raster over the surface of III-Nitride semiconductor body 140/240, or whether ion beam 132/232 is to be a wide area de-focused ion beam allowing for a blanket, stenciled, or sacrificially masked, ion implantation over a larger area of III-Nitride semiconductor body 140/240.

Flowchart 300 continues with situating III-Nitride semiconductor body 140/240 in implantation chamber 100/200 (320). As shown in FIGS. 1 and 2, III-Nitride semiconductor body 140/240 and support substrate 112/212 may be situated in surface equilibrium chamber 110/210 of implantation chamber 100/200. As noted above, III-Nitride semiconductor body 140/240 may have been grown over support substrate 112/212 prior to its being situated in surface equilibrium chamber 110/210 of implantation chamber 100/200.

III-Nitride semiconductor body 140/240 may correspond to a body formed from any one or more suitable III-Nitride semiconductor materials, as are described in the definition section above. Typically, the only constraint placed upon the composition of III-Nitride semiconductor body 140/240 is that it include at least one layer of III-Nitride semiconductor material. In some implementations, III-Nitride semiconductor body 140/240 may include a first III-Nitride semiconductor layer and a second III-Nitride semiconductor layer formed over the first III-Nitride semiconductor layer, for example, wherein the second III-Nitride semiconductor layer includes a III-Nitride semiconductor having a wider band gap than the III-Nitride semiconductor forming the first III-Nitride semiconductor layer.

As a specific example, III-Nitride semiconductor body 140/240 may include a heterojunction formed by the interface of a GaN channel layer and an aluminum gallium nitride (AlGaN) barrier layer formed over the GaN channel layer. Other examples of III-Nitride semiconductor bodies corresponding to III-Nitride semiconductor body 140/240 include commonly used epilayers found within the structures of microelectronic and optoelectronic III-Nitride devices including transistors, diodes, light-emitting diodes (LEDs), laser diodes, detectors, and sensors.

Flowchart 300 continues with establishing a gas pressure (i.e., gas overpressure) greater than or approximately equal to a surface equilibrium pressure of III-Nitride semiconductor body 140/240 (330). The gas pressure may be established within implantation chamber 100/200, using surface equilibrium chamber 110/210, based on the previously identified implantation conditions and the material composition of III-Nitride semiconductor body 140/240, typically within the partial vacuum range of about 1.0-1000 mTorr. Establishing the desired gas pressure may be accomplished by controlling the gas pressure within surface equilibrium chamber 110/210 through use of intake port 102/202 and output port 104/204.

The source gas or gases for establishing the gas pressure at a surface of III-Nitride semiconductor body 140/240 may be selected from any suitable nitrogen containing gas, such as nitrogen gas or ammonia, for example. The specific gas pressure required to prevent decomposition of III-Nitride semiconductor body 140/240 is dependent on factors such as the composition of the surface layer of III-Nitride semiconductor body 140/240, the temperature of III-Nitride semiconductor body 140/240, and the specific gas species being utilized. As a result, the gas pressure required will change with the temperature of III-Nitride semiconductor body 140/240, and the apparatus will be required to adjust the pressure so as to maintain the equilibrium condition and prevent decomposition of at a surface of III-Nitride semiconductor body 140/240.

Flowchart 300 continues with heating III-Nitride semiconductor body 140/240 to the implantation temperature while maintaining the gas pressure, or overpressure, at greater than or approximately equal to the surface equilibrium pressure of III-Nitride semiconductor body 140/240 (340). One of the advantageous features of the present solution is that III-Nitride semiconductor body 140/240 may be heated to an elevated implantation temperature while the gas pressure within surface equilibrium chamber 110/210 is controlled such that a surface layer of III-Nitride semiconductor body 140/240 does not decompose. For example, III-Nitride semiconductor body 140/240 may be heated to an elevated implantation temperature in a range from approximately five hundred degrees Centigrade (500° C.) to approximately eleven hundred degrees Centigrade (1100° C.).

According to some implementations it may be advantageous or desirable to perform implantation at an elevated implantation temperature greater than approximately 600° C., while in other implementations it may be advantageous or desirable to perform implantation at an elevated implantation temperature greater than approximately 800° C. Moreover, in some implementations, it may be advantageous or desireable to perform implantation at an elevated implantation temperature that is greater than a temperature used for growth of III-Nitride semiconductor body 140/240.

It is noted that although in the exemplary implementation disclosed by reference to flowchart 300, III-Nitride semiconductor body 140/240 is described as being situated in implantation chamber 100/200 before establishment of the implantation temperature, including heating of platform 106/206, that is only one possibility. In other implementations, the implantation temperature may be established and platform 106/206 of implantation chamber 100/200 may be preheated to or near the implantation temperature before III-Nitride semiconductor body 140/240 is situated therein.

Flowchart 300 continues with implanting III-Nitride semiconductor body 140/240 in implantation chamber 100/200 while substantially maintaining the gas pressure above the exposed surface of III-Nitride semiconductor body 140/240 at greater than or approximately equal to the surface equilibrium pressure of III-Nitride semiconductor body 140/240 (350). Substantially maintaining the gas pressure at greater than or approximately equal to the surface equilibrium pressure of III-Nitride semiconductor body 140/240 may be performed using surface equilibrium chamber 110/210 of implantation chamber 100/200.

Implantation may be performed using ion implanter 130/230 interfacing with surface equilibrium chamber 110/210, and may result in any desired ion species being implanted into III-Nitride semiconductor body 140/240. Thus, N type dopant ion, such as silicon (Si) ions, and/or P type dopant ions, such as magnesium (Mg) ions, for example, may be implanted into III-Nitride semiconductor body 140/240.

In some implementations, the implantation conditions may include use of one or more stencils to form corresponding one or more spatially confined implantation regions at or beneath the surface of III-Nitride semiconductor body 140/240. Moreover, in still other implementations, implantation may include steering of ion beam 132/232, or movement of III-Nitride semiconductor body 140/240, during implantation so as to produce one or more spatially confined implantation regions at or beneath the surface of III-Nitride semiconductor body 140/240. For example, movement of III-Nitride semiconductor body 140/240 during implantation may be achieved through controlled movement of platform 106/206. Where III-Nitride semiconductor body 140/240 has been grown undoped, for example, N type doping and P type doping may both be performed, resulting in formation of a spatially confined N type region laterally adjacent a spatially confined P type region in III-Nitride semiconductor body 140/240.

In some implementations, relatively low energy surface implantation of III-Nitride semiconductor body 140/240 may be advantageous or desirable, utilizing implantation energies of less than approximately 100 keV, for example. That is to say, in some implementations, relatively low implantation energies may be used in order to implant dopant ions near the surface of III-Nitride semiconductor body 140/240. In other implementations, however, deeper penetration into III-Nitride semiconductor body 140/240 may be desired, so that higher implantation energies may be employed. Using the solution disclosed herein, III-Nitride semiconductor body 140/240 can be doped to any reasonably achievable concentration, for example, to a concentration from approximately $10^{11}/cm^2$ to approximately $10^{19}/cm^2$.

Flowchart 300 continues with optionally performing a substantial anneal of III-Nitride semiconductor body 140/240 to anneal ion implantation damage and substantially activate the implanted dopant(s) (360). During such an optional process, the temperature of implanted III-Nitride semiconductor body 140/240 may be adjusted to an appropriate annealing temperature to substantially anneal any damage that may have occurred to the III-Nitride crystal structure from the impinging high energy ions, as well as to substantially electrically activate the implanted dopants. That is to say, the method of flowchart 300 may include annealing III-Nitride semiconductor body 140/240 in-situ at elevated temperature post implantation to achieve substantial dopant activation.

Flowchart 300 may conclude with cooling down the III-Nitride body, for example to approximately room temperature, while maintaining the surface equilibrium pressure (370). Once the III-Nitride body is cooled to the desired temperature, the III-Nitride body may be removed from the implant chamber.

As noted above, one of the advantages provided by the solution disclosed herein is that the gas pressure within surface equilibrium chamber 110/210 is substantially maintained during implantation of III-Nitride semiconductor body 140/240. Substantially maintaining the gas pressure during implantation substantially prevents decomposition of III-Nitride semiconductor body 140/240 during implantation, despite its being exposed to an elevated implantation temperature. Consequently, the structural and stoichiometric properties of III-Nitride semiconductor body 140/240 can by preserved during implantation.

Figure 4:
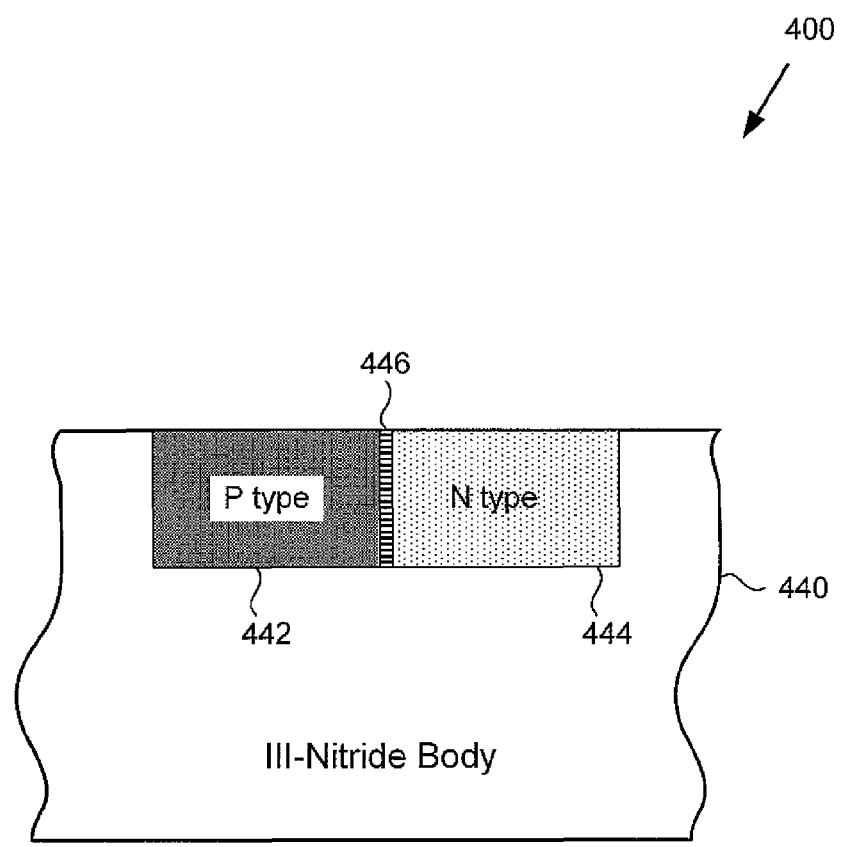
FIG. 4 shows a cross-sectional representation of a P-N junction formed in a III-Nitride semiconductor body as a result of ion implantation at high temperature surface equilibrium conditions, according to one implementation.

Some of the advantages resulting from the solution disclosed in the present application are depicted in FIGS. 4, 5A, 5B, 5C, 6A, 6B, and 6C. Referring first to FIG. 4, FIG. 4 shows a cross-sectional representation of a P-N junction formed in a III-Nitride semiconductor body as a result of ion implantation at high temperature surface equilibrium conditions, according to one implementation. Structure 400, in FIG. 4, includes P type region 442 and N type region 444 formed in III-Nitride semiconductor body 440. III-Nitride semiconductor body 440 corresponds in general to III-Nitride semiconductor body 140/240, shown in FIG. 1/2, and may share any of the characteristics attributed to that corresponding feature, above.

As shown in FIG. 4, both P type region 442 and N type region 444 are spatially confined within III-Nitride semiconductor body 440, and have been selectively formed so as to be laterally adjacent one another. Moreover, spatially confined P type region 442 and spatially confined N type region 444 have been advantageously implanted to be laterally spatially confined and adjoining within III-Nitride body 440 so as to produce P-N junction 446 at their interface/overlap. Structure 400 may be utilized in the implementation of a diode, for example, or a portion of a bipolar junction transistor fabricated in III-Nitride body 440.

Figure 5A:
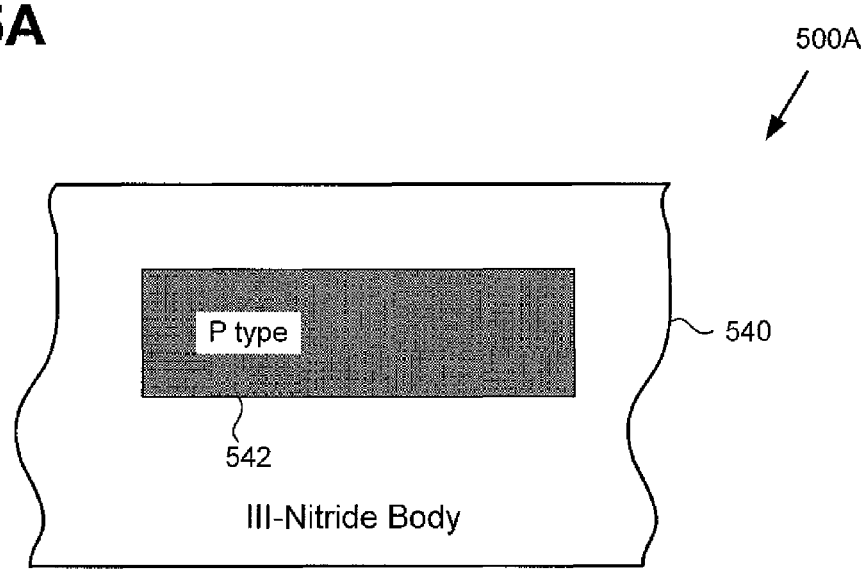
FIG. 5A shows a cross-sectional representation of a buried P type region formed in a III-Nitride semiconductor body as a result of ion implantation at high temperature surface equilibrium conditions, according to one implementation.
Figure 5B:
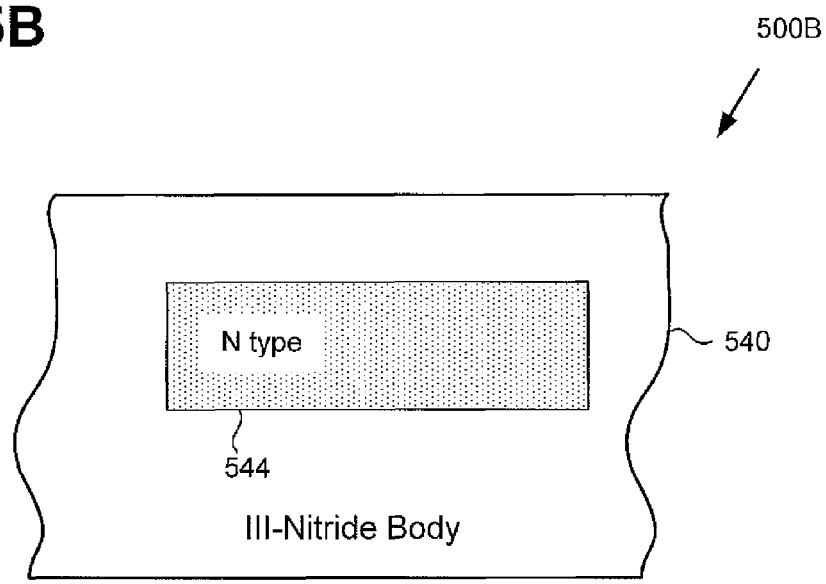
FIG. 5B shows a cross-sectional representation of buried N type region formed in a III-Nitride semiconductor body as a result of ion implantation at high temperature surface equilibrium conditions, according to another implementation.
Figure 5C:
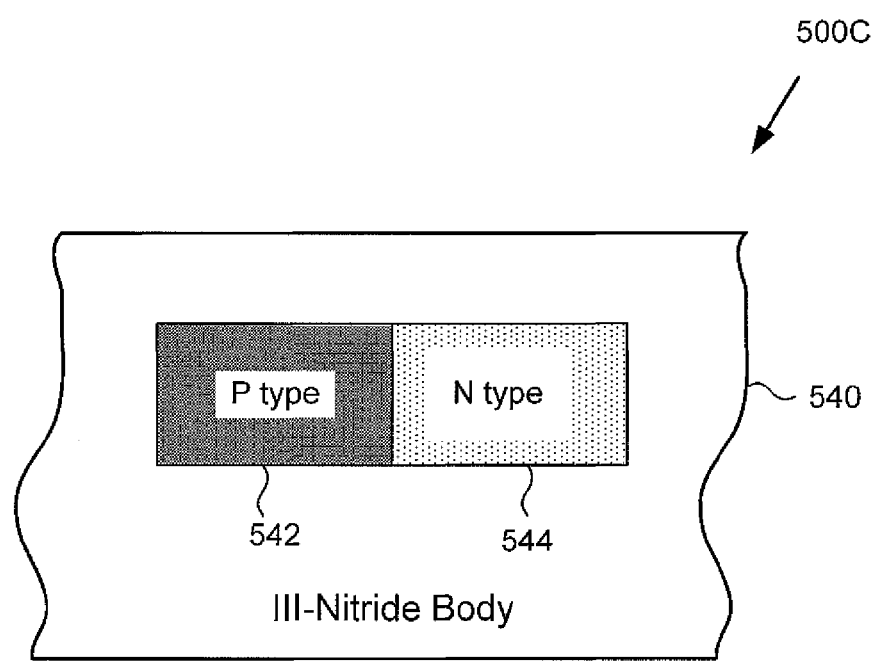
FIG. 5C shows a cross-sectional representation of buried P type and N type regions formed in a III-Nitride semiconductor body as a result of ion implantation at high temperature surface equilibrium conditions, according to yet another implementation.

Moving to FIGS. 5A, 5B, and 5C, FIGS. 5A, 5B, and 5C show respective cross-sectional representations of buried P type and/or N type regions formed in a III-Nitride semiconductor body as a result of ion implantation at high temperature surface equilibrium conditions, according to various implementations. Structure 500A, in FIG. 5A, includes spatially confined P type region 542 formed in III-Nitride semiconductor body 540. III-Nitride semiconductor body 540 corresponds in general to III-Nitride semiconductor body 140/240, shown in FIG. 1/2, and may share any of the characteristics attributed to that corresponding feature, above. As shown in FIG. 5A, P type region 542 is spatially confined within III-Nitride semiconductor body 540 and is buried to a predetermined depth beneath a top surface of HI-Nitride semiconductor body 540.

Continuing to FIG. 5B, structure 500B includes spatially confined N type region 544 formed in III-Nitride semiconductor body 540. As shown in FIG. 5B, N type region 544 is spatially confined within III-Nitride semiconductor body 540 and is buried to a predetermined depth beneath the top surface of III-Nitride semiconductor body 540.

Referring to FIG. 5C, structure 500C includes spatially confined P type region 542 and spatially confined N type region 544 formed in III-Nitride semiconductor body 540. P type region 542 and N type region 544 are spatially confined within III-Nitride semiconductor body 540, and can be selectively formed so as to be laterally adjacent or adjoining one another. As shown in FIG. 5C, P type region 542 and N type region 544 are spatially confined within III-Nitride semiconductor body 540 and are buried to a predetermined depth beneath the top surface of III-Nitride semiconductor body 540.

Figure 6A:
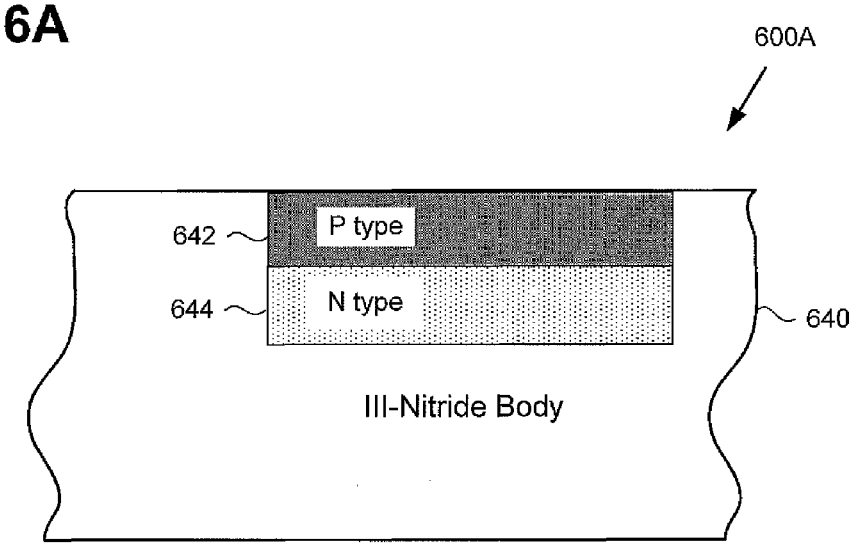
FIG. 6A shows a cross-sectional representation of vertically stacked P type and N type regions formed in a III-Nitride semiconductor body as a result of ion implantation at high temperature surface equilibrium conditions, according to one implementation.
Figure 6B:
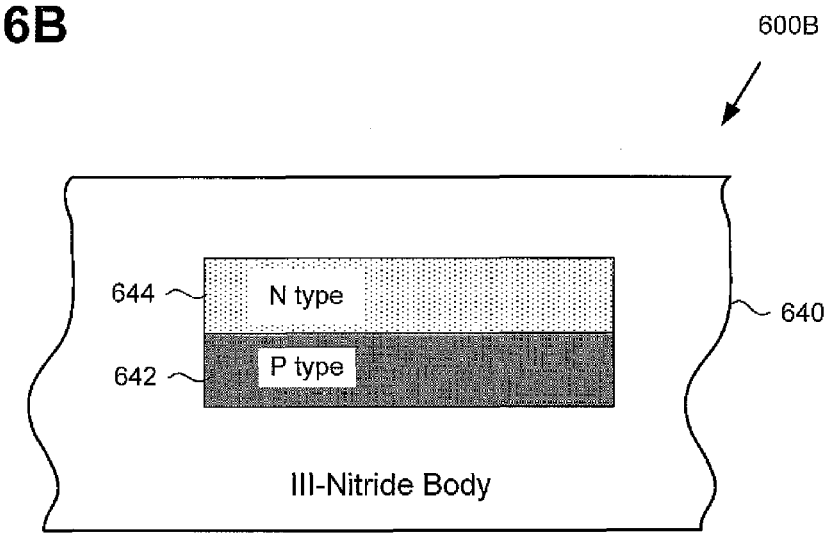
FIG. 6B shows a cross-sectional representation of vertically stacked and buried P type and N type regions formed in a III-Nitride semiconductor body as a result of ion implantation at high temperature surface equilibrium conditions, according to another implementation.
Figure 6C:
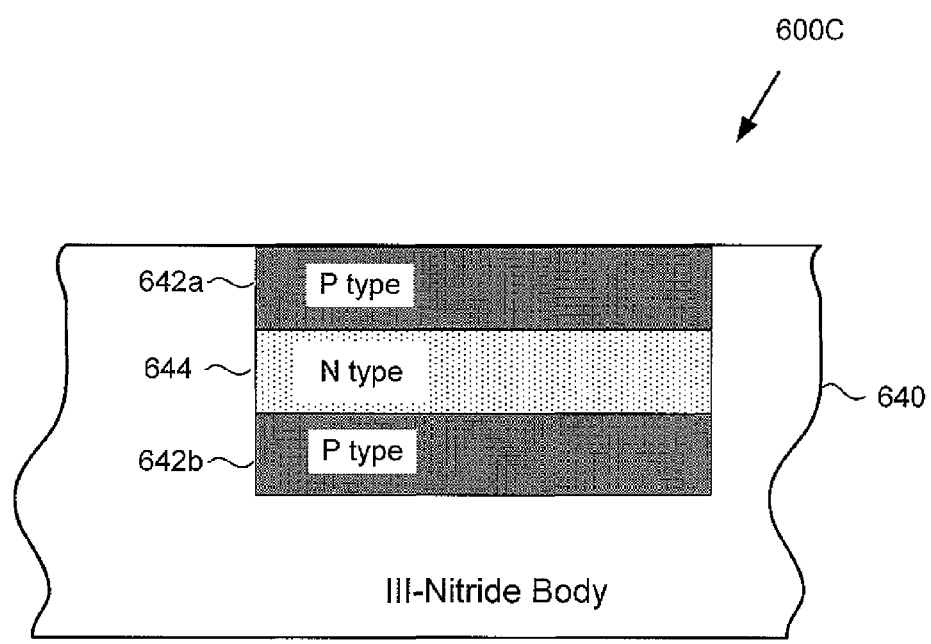
FIG. 6C shows a cross-sectional representation of vertically stacked P type and N type regions formed in a III-Nitride semiconductor body as a result of ion implantation at high temperature surface equilibrium conditions, according to yet another implementation.

Moving to FIGS. 6A, 6B, and 6C, FIGS. 6A, 6B, and 6C show respective cross-sectional representations of vertically stacked P type and N type regions formed in a III-Nitride semiconductor body as a result of ion implantation at high temperature surface equilibrium conditions, according to various implementation. Structure 600A, in FIG. 6A, includes spatially confined N type region 644 formed in III-Nitride semiconductor body 640, and spatially confined P type region 642 formed at or near a top surface of III-Nitride semiconductor body 640 and stacked over N type region 644. III-Nitride semiconductor body 640 corresponds in general to III-Nitride semiconductor body 140/240, shown in FIG. 1/2, and may share any of the characteristics attributed to that corresponding feature, above.

Continuing to FIG. 6B, structure 600B includes spatially confined N type region 644 formed in III-Nitride semiconductor body 640 and stacked over spatially confined P type region 642. As shown in FIG. 5B, P type region 642 and N type region 644 are spatially confined within III-Nitride semiconductor body 640 and are buried to respective predetermined depths beneath the top surface of III-Nitride semiconductor body 640.

Although FIGS. 6A and 6B depict formation of two different implanted regions spatially confined within III-Nitride semiconductor body 640 and stacked vertically on one another, it is noted that more than two spatially confined implanted regions may be formed, for example P-N-P and N-P-N vertically stacked arrangements. FIG. 6C shows an example of a P-N-P structure. P type regions 642a and 642b, and N type region 644 are spatially confined within III-Nitride semiconductor body 640, and have been selectively formed so that N type region 644 is formed between P type region 642a and P type region 642b within III-Nitride semiconductor body 640. It is further noted that in such implementations, the upper doped region (e.g., P type region 642a, in FIG. 6C) may be formed at or near the top surface of III-Nitride semiconductor body 640, or may be buried so as to be situated at a substantial depth beneath the the top surface of III-Nitride semiconductor body 640. Analogously, the lower doped region (e.g., P type region 642b, in FIG. 6C) may be formed at or near a bottom surface of III-Nitride semiconductor body 640, or may be situated at a height substantially above the bottom surface.

Thus, the concepts disclosed by the present application enable laterally selective, spatially confined ion implantation of a III-Nitride semiconductor body at an elevated implantation temperature, while concurrently preserving the structural and stoichiometric properties of the semiconductor material. As a result, the present application discloses an approach that makes it possible to advantageously perform junction engineering in a III-Nitride semiconductor body. In addition, because the present inventive concepts may be applied to facilitate either N type or P type dopant implantation, the fabrication of bipolar or reduced surface field (RESURF) devices is rendered significantly easier to achieve.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method comprising:
   situating a III-Nitride semiconductor body in a surface equilibrium chamber;
   establishing a gas pressure greater than or approximately equal to a surface equilibrium pressure of said III-Nitride semiconductor body using a nitrogen containing gas, said gas pressure being greater than or approximately equal to 1 mTorr;
   heating said III-Nitride semiconductor body to an elevated implantation temperature in said surface equilibrium chamber while substantially maintaining said gas pressure;
   implanting said III-Nitride semiconductor body in said surface equilibrium chamber at said elevated implantation temperature while substantially maintaining said gas pressure;
   wherein said implanting is performed using an ion implanter interfacing with said surface equilibrium chamber.

2. The method of claim 1, wherein substantially maintaining said gas pressure during said implanting substantially prevents decomposition of said III-Nitride semiconductor body during said implanting.

3. The method of claim 1, wherein said elevated implantation temperature is in a range from approximately five hundred degrees Centigrade to approximately eleven hundred degrees Centigrade.

4. The method of claim 1, wherein said elevated implantation temperature is greater than a growth temperature of said III-Nitride semiconductor body.

5. The method of claim 1, wherein said implanting results in formation of a laterally spatially confined doped region in said III-Nitride semiconductor body.

6. The method of claim 1, wherein dopants implanted into said III-Nitride semiconductor body are substantially electrically activated without substantial decomposition of a surface of said III-Nitride semiconductor body.

7. The method of claim 1, wherein said III-Nitride semiconductor body is annealed in-situ at elevated temperature post implantation to achieve substantial dopant activation.

8. The method of claim 7 wherein dopants implanted into said III-Nitride semiconductor body are substantially electrically activated without substantial decomposition of a surface of said III-Nitride semiconductor body.

9. The method of claim 1, wherein said implanting results in formation of at least one of a spatially confined N type region and a spatially confined P type region in said III-Nitride semiconductor body.

10. The method of claim 1, wherein said implanting results in formation of a P-N junction in said III-Nitride semiconductor body.

11. An implantation chamber comprising:
    a surface equilibrium chamber for establishing a gas pressure greater than or approximately equal to a surface equilibrium pressure of a III-Nitride semiconductor body at an elevated implantation temperature, said gas pressure being established using a nitrogen containing gas and being greater than or approximately equal to 1 mTorr;
    an ion implanter interfacing with said surface equilibrium chamber;
    said implantation chamber configured to implant said III-Nitride semiconductor body using said ion implanter while substantially maintaining said gas pressure using said surface equilibrium chamber at said elevated implantation temperature.

12. The implantation chamber of claim 11, further comprising a transition chamber configured to interface said ion implanter and said surface equilibrium chamber, said transition chamber including at least one differential pressure cell.

13. The implantation chamber of claim 11, wherein said elevated implantation temperature is greater than a growth temperature of said III-Nitride semiconductor body.

14. The implantation chamber of claim 11, wherein said elevated implantation temperature is in a range from approximately five hundred degrees Centigrade to approximately eleven hundred degrees Centigrade.

15. The implantation chamber of claim 11, wherein said implantation chamber is configured to substantially prevent decomposition of said III-Nitride semiconductor body during implantation.

16. The implantation chamber of claim 11, wherein said ion implanter is configured to implant a P type dopant into said III-Nitride semiconductor body.

17. The implantation chamber of claim 11, wherein said implantation chamber is configured to form a laterally spatially confined doped region in said III-Nitride semiconductor body.

18. The implantation chamber of claim 11, wherein said ion implanter is configured to implant a P type dopant and an N type dopant into said III-Nitride semiconductor body.

19. The implantation chamber of claim 11, wherein said implantation chamber is configured to form a spatially confined N type region laterally adjacent a spatially confined P type region in said III-Nitride semiconductor body.

20. The implantation chamber of claim 11, wherein said implantation chamber is configured to form a P-N junction in said III-Nitride semiconductor body.

* * * * *